United States Patent [19]

Cho et al.

[11] 4,236,122
[45] Nov. 25, 1980

[54] MESA DEVICES FABRICATED ON CHANNELED SUBSTRATES

[75] Inventors: Alfred Y. Cho; Won-Tien Tsang, both of Summit, N.J.

[73] Assignee: Bell Telephone Laboratories, Incorporated, Murray Hill, N.J.

[21] Appl. No.: 900,123

[22] Filed: Apr. 26, 1978

Related U.S. Application Data

[62] Division of Ser. No. 777,400, Mar. 14, 1977, Pat. No. 4,099,305.

[51] Int. Cl.³ ............................................. H01S 3/19
[52] U.S. Cl. ............................ 331/94.5 H; 357/18; 357/56
[58] Field of Search ................. 331/94.5 H; 357/17, 357/18, 55, 56, 60

[56] References Cited

U.S. PATENT DOCUMENTS

| | | | |
|---|---|---|---|
| 3,457,633 | 7/1969 | Marinace et al. | 357/60 X |
| 3,725,147 | 4/1973 | Roizin et al. | 357/60 X |
| 3,996,528 | 12/1976 | Blum et al. | 331/94.5 H |
| 4,032,944 | 6/1977 | Dongen et al. | 357/55 X |
| 4,128,845 | 12/1978 | Sakai | 357/55 X |

OTHER PUBLICATIONS

Nagata et al., "Self-Masking Selective Epitaxoy by Molecular-Beam Method," *Journal of Applied Physics*, vol. 48, No. 3, Mar. 1977, pp. 940-942.
Lee et al., "Low-Threshold Room-Temperature Embedded Heterostructure Lasers," *Applied Physics Letters*, vol. 29, No. 6, Sep. 15, 1976, pp. 365-367.
Cho et al., "Continuous Room-Temperature Operation of $GaAs-Al_xGa_{1-x}As$ Double-Heterostructure Lasers Prepared by Molecular-Beam Epitaxy," *Applied Physics Letters*, vol. 28, No. 9, May 1, 1976, pp. 501-503.
Zory, "Continuous Wave Laser Array," *IBM Technical Disclosure Bulletin*, vol. 18, No. 10, Mar. 1976, p. 3497.

*Primary Examiner*—James W. Davie
*Attorney, Agent, or Firm*—Michael J. Urbano

[57] ABSTRACT

Parallel channels are separated by ridges formed in a semiconductor body in such a way that each channel is wider at its base than at its top. Molecular beam epitaxy is used to deposit semiconductor layers on the ridges and in the channels. Because each channel is narrower at its top than at its base, the configuration is essentially self-masking. That is, the layers in the channel are physically separate from those on the ridges, as would be metallic contacts deposited on the layers. This technique is employed in the fabrication of a plurality of self-aligned, stripe geometry, mesa double heterostructure junction lasers.

4 Claims, 3 Drawing Figures

MESA DEVICES FABRICATED ON CHANNELED SUBSTRATES

This application is a Divisional of copending application Ser. No. 777,400 filed on Mar. 14, 1977, now U.S. Pat. No. 4,099,305, issued on July 11, 1978.

BACKGROUND OF THE INVENTION

This invention relates to molecular beam epitaxy (MBE) on channeled substrates and, more particularly, to the use of the technique to fabricate mesa geometry semiconductor devices such as stripe geometry junction lasers.

The stripe geometry junction laser was first proposed by R. A. Furnanage and D. K. Wilson (U.S. Pat. No. 3,363,195 issued on Jan. 9, 1968) as a means to reduce the number of lasing modes. The stripe geometry also reduces the threshold current for lasing, which alleviates heat sinking and other problems, and limits the spatial width of the output beam, which facilitates coupling into an optical fiber. Since that early proposal, numerous laser configurations have been devised to implement the stripe geometry concept, but clearly the front runner, both in terms of widespread usage as well as reliability, is the proton bombarded double heterostructure (DH) laser described by J. C. Dyment et al, *Applied Physics Letters*, Vol. 10, page 84 (1967), and L. A. D'Asaro et al, U.S. Pat. No. 3,824,133 issued on July 16, 1974.

Notwithstanding the success of DH stripe junction lasers delineated by proton bombardment, workers in the art have suggested a virtual plethora of alternative structures aimed primarily at one or more objects such as lowering the lasing threshold, controlling filamentary light outputs and producing more symmetric light beams. One such configuration is the mesa stripe geometry laser. T. Tsukada et al, *Applied Physics Letters*, Vol 20, page 344 (1972) fabricate such a laser by LPE growth of a double heterostructure, chemically etching a mesa stripe, coating the side walls of the mesa with a silicon phosphate glass film and then depositing a metal contact on the entire upper surface. Similarly, R. A. Logan et al, U.S. Pat. No. 3,833,435 issued on Sept. 3, 1974, subject an LPE GaAs-AlGaAs heterostructure to a slow $Br_2$-methanol etch to form a stripe mesa and then regrow AlGaAs by LPE or MBE. Alternatively, Logan et al describe a self-masking structure in which, after the $Br_2$-methanol etch, the GaAs active region is selectively etched to undercut the cladding layers and form a pedestal-like mesa. Direct deposition of a metallic contact is then made without shorting the junction in the active region.

Others have reversed the process of chemical etching and LPE growth to fabricate what have been termed embedded epitaxy heterostructures. Thus, for example, I. Samid and C. P. Lee et al, *Applied Physics Letters*, Vol. 27, page 405 (1975), used an $Al_2O_3$ mask and a $Br_2$-methanol preferential etch to form [01$\bar{1}$] oriented channels in a (100) GaAs substrate and then grew $Al_{.4}Ga_{.6}As$-GaAs-$Al_{.4}Ga_{.6}As$-GaAs by LPE in the channels. In a later paper, *Applied Physics Letters*, Vol. 29, page 365 (1976), the same authors report an improved version of embedded heterostructure LPE lasers using a native oxide mask and $H_2SO_4:H_2O_2:H_2O$ (5:1:1) to etch channels in the [01$\bar{1}$] direction.

SUMMARY OF THE INVENTION

It is a broad object of our invention to fabricate mesa geometry semiconductor devices.

It is a more specific object of our invention to fabricate mesa stripe geometry semiconductor junction lasers, particularly those of the DH type.

It is another object of our invention to fabricate such devices by MBE without the need for oxide masking or proton bombardment.

These and other objects are accomplished in accordance with an illustrative embodiment of our invention, a process in which parallel channels separated by ridges are formed in a semiconductor wafer in such a way that each channel is wider at its base than at its top. MBE is used to deposit semiconductor layers on the ridges, which define a mesa geometry, and in the channels in order to form a desired device structure. For example, layers of suitable composition, conductivity type and thickness can be tailored to fabricate junction lasers or microwave and millimeter wave devices.

It is a feature of our invention that each channel is made to be narrower at its top than at its base (i.e., generally trapezoidal) so that the ridges act as shadow masks to the molecular beams. As a consequence, in one embodiment the resulting devices are essentially self-masking; that is, the layers (and hence devices) in the channels are physically separate from those on the ridges, as would be metallic contacts deposited on the layers. Accordingly the need for oxide masking is obviated.

It is another feature of our invention that a single masking and etching step makes all of the channels and ridges parallel to one another so that the resulting array of devices are self-aligned. Where the devices are DH junction lasers, beams of radiation emanate in a direction parallel to the channels, a feature useful in producing high power optical outputs.

An alternative to an array of self-aligned devices is a plurality of discrete devices which result from cleaving or otherwise separating the wafer along the channels.

In addition, although the semiconductor layers in the channels and on the ridges could both have utility as devices, those deposited on the ridges are to be preferred for several reasons. First, because the ridges extend above the original wafer surface, bonding to a heat sink is facilitated. Second, for the same reason, masking is also facilitated. Third, where discrete mesa devices are to be formed, cleaving in the channels may destroy or render layers there unsuitable to device application. Fourth, the ridges can be made sufficiently narrow (e.g., 10 μm), that stripe geometry junction lasers can be made without the need for proton bombardment.

BRIEF DESCRIPTION OF THE DRAWING

Our invention, together with its various features and advantages, can be readily understood from the following more detailed description taken in conjunction with the accompanying drawing in which.

DETAILED DESCRIPTION

Figure 1:
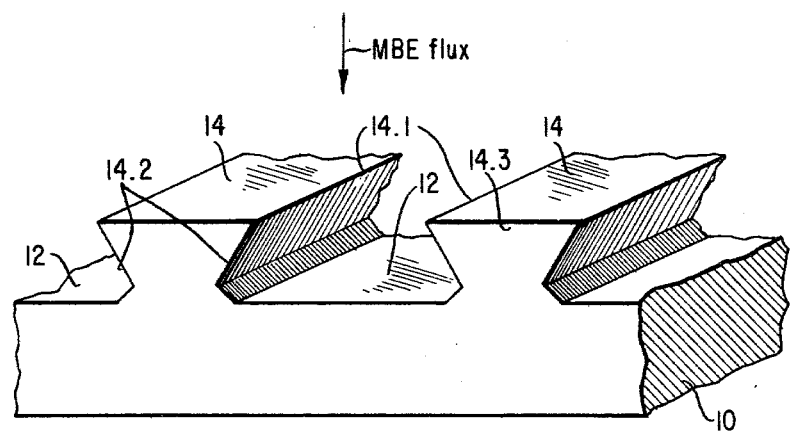
FIG. 1 is a schematic end view of a GaAs wafer with channels and ridges etched in accordance with one aspect of our invention.
Figure 2:
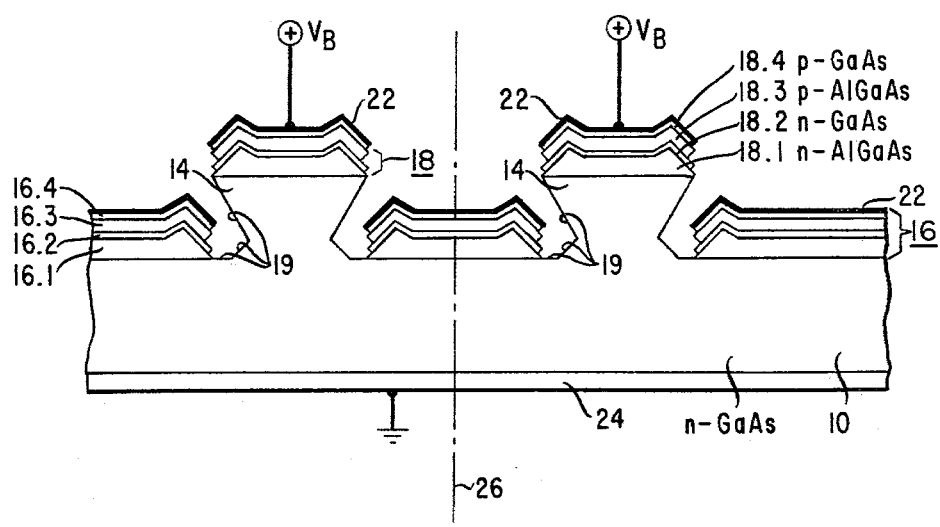
FIG. 2 is a schematic end view of GaAs-AlGaAs DH mesa lasers fabricated by MBE on the ridges of FIG. 1 with self-masking contacts formed by evaporation.

With reference now to FIG. 1, there is shown a semiconductor wafer 10 having a plurality of parallel channels 12 separated by parallel ridges 14. Each channel 12 is narrower at its top than at its base and illustratively has a trapezoidal shape. Conversely, the ridges are wider at their topmost surfaces 14.3 than immediately thereunder and at their bottoms. In order to fabricate semiconductor devices, the wafer 10 is mounted in an MBE UHV growth chamber, and heated to a suitable growth temperature. After evacuation to a subatmospheric pressure, molecular beams of suitable species are directed perpendicular to the channeled wafer surface, causing epitaxial layers to grow on the base of each channel and the top of each free-standing ridge as shown in FIG. 2. Because the channels are narrower at their top than at their base, the top edges 14.1 of adjacent ridges serve as two-edge shadow masks preventing atoms/molecules of the incident MBE flux from impinging on the surface directly underneath them. As a result, a strip of epitaxial layers 16, completely disconnected from the layers 18 on the ridges 14, is grown in the channels 12. As shown in FIG. 2, layer 18.1 is wider at its bottommost surface than at its topmost surface.

The composition, doping and thickness of epitaxial layers 18, by well known MBE techniques, can be tailored to fit particular device designs, whether they be optical such as junction lasers or non-optical such as millimeter wave diodes. In either case, however, the devices have the desired mesa geometry, which reduces capacitance and increases the cut-off frequency in the case of millimeter wave diodes and obviates the need for proton bombardment in junction lasers. An example of the latter follows, it being understood that the specific parameters given are illustrative only and should not be construed as limitations on the scope of the invention.

EXAMPLE

Figure 3:
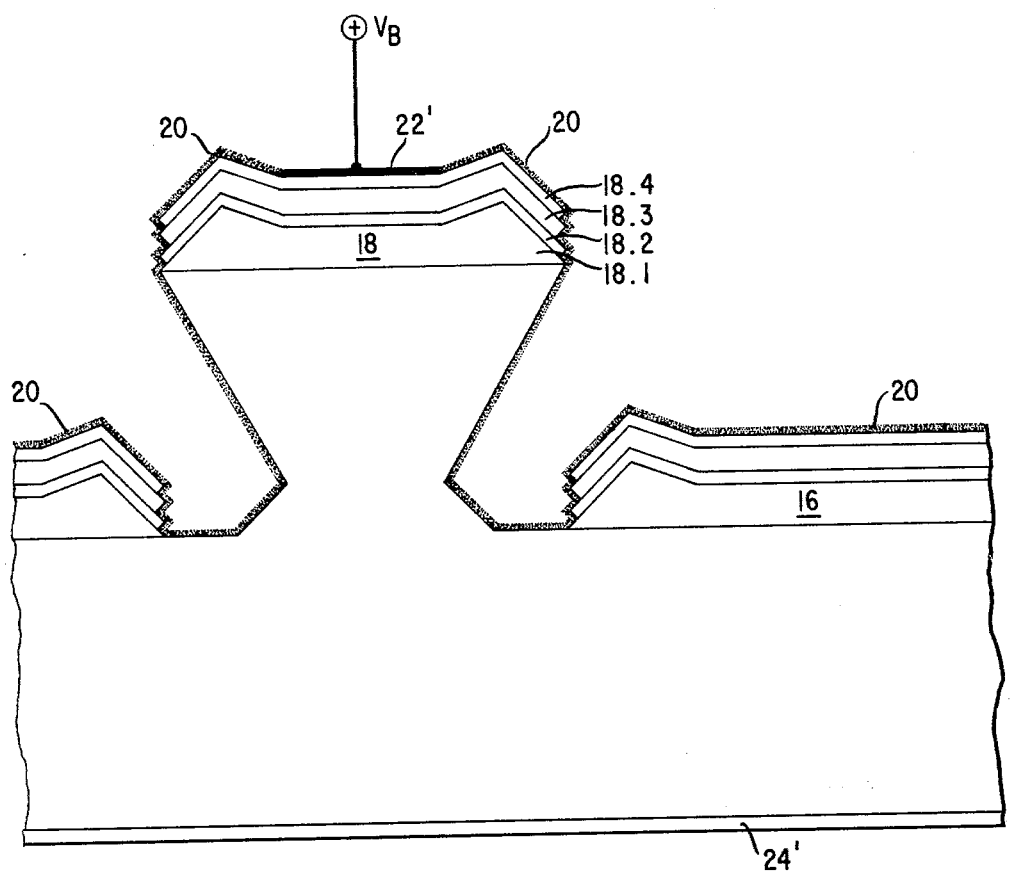
FIG. 3 is similar to FIG. 2 except that the contacts are formed by oxide masking and electroplating.

An n-type (001)-oriented GaAs wafer 10 was first etch-polished in a $Br_2$-methanol solution and then coated with a standard photoresist (AZ-1350J), not shown. A parallel array of photoresist stripes about 20 $\mu$m wide on 250 $\mu$m centers were formed on the wafer surface using conventional photolithographic techniques. These stripes were aligned in the [$\bar{1}10$] direction and were used as masks in subsequent chemical etching using a preferential etching solution of $H_2SO_4:H_2O_2$ (30%):$H_2O$ = 1:8:10 (24 degrees C.). The unmasked areas were etched to a depth of about 3 to 9 $\mu$m (the etch rate was about 3 $\mu$m/min), to form parallel ridges 14 separated by parallel trapezoidal channels 12. The undercut side walls 14.2 of ridges 14 were {111} planes as shown in FIG. 1. Next, the photoresist mask was removed and followed by a brief chemical cleaning (about a 5 sec dip in the same etchant as above), the substrate was then mounted inside an MBE chamber. Using well-known MBE techniques (see U.S. Pat. Nos. 3,615,931 and 3,928,092) with the beams directed substantially perpendicular to the wafer, we fabricated the as-grown mesa-DH laser structure shown schematically in FIGS. 2 and 3. The formation of these mesa laser structures depends on the presence of the undercut side walls of the ridges which effectively act as a parallel array of edge shadowing masks. As a result, the epitaxial layers were separated laterally into stripes 16 and 18.

More specifically, the DH lasers formed on the ridges 14 comprised an n-type $Al_{0.3}Ga_{0.7}As$ cladding layer 18.1 doped with Sn to $2 \times 10^{17}/cm^3$ and 3.5 $\mu$m thick, an n-type GaAs active layer 18.2 doped with Sn to $1 \times 10^{17}/cm^3$ and 0.5 $\mu$m thick, a p-type $Al_{0.3}Ga_{0.7}As$ cladding layer 18.3 doped with Mn to $2 \times 10^{17}/cm^3$ and 2 $\mu$m thick and a p-type GaAs cap layer 18.4 for contact purposes. Layers 16.1 to 16.4, which simultaneously grew in the channels 12, correspond respectively, to layers 18.1 to 18.4 on the ridges.

Electrical contacts were made by two different methods, evaporation and electroplating. In the evaporation method, Cr-Au films 22 were evaporated directly onto the epi-layers grown on the ridged wafer surface as shown in FIG. 2. The undercut sidewalls of the ridges again functioned as a parallel array of edge shadow-masks and resulted in laterally separated electrical contacts. In-Au films were used for the back side contact 24 after the wafer 10 was first lapped down to about 150 $\mu$m. In this particular experiment at self-masking contacts, however, no effort was made to insure that the evaporation beam of metal vapor was incident perpendicular to the wafer. As a consequence some of the lasers had electrical shorts caused probably by deposition of metal in the zones 19 between layers 16 and ridges 14. We expect that such shorts can be virtually eliminated by substantially normal incidence of the metal vapor.

In contrast to the self-masking process by evaporation, in the electroplating method a native oxide film 20 was first formed on the epi-layers grown on the ridged wafer surface by well-known anodization techniques, and stripe-windows in the oxide film were then opened on the mesa tops by conventional photolithographic techniques. The oxide exposed through the windows was removed with HCl. Au-Zn-Au contacts 22' were formed in the window areas only by electroplating. Because current does not flow through the oxide during the electroplating process, no metal is deposited on the oxide. Au-Sn-Ni-Au were used to form the back side contact 24'. Although this process resulted in lasers with fewer electrical shorts, it is more complicated and, as explained above, we expect direct evaporation with normal incidence to produce self-masked contacts and to be preferred.

In order to generate laser radiation ($\lambda \sim 8900$ Angstrom units), the mesa lasers were forward biased by voltage $V_B$ and current was applied in excess of the lasing threshold (about 300 mA).

For a laser diode about 18.5 $\mu$m wide as measured at the top and 186 $\mu$m long, the threshold current density was 30 $kA/cm^2$ before annealing and reduced to 9.7 $kA/cm^2$ after annealing. (See U.S. Pat. No. 3,974,002.) The differential quantum efficiency was 12%. This rather high threshold before annealing is probably partly due to an inferior crystal growth on a substrate contaminated by the photoresist process. No attempt was made to etch-polish the substrate after the ridge was formed and before mounting into the MBE chamber because a normal etch-polishing (e.g., with $Br_2$-methanol) would destroy the ridge-structured wafer surface. As mentioned earlier, the active layer thickness of these structures was about 0.5 $\mu$m. Thinner active regions (e.g., 0.15 $\mu$m) should result in considerably lower threshold current density.

As mentioned previously, discrete stripe geometry mesa lasers can be formed by cleaving or otherwise separating along planes such as 26 in FIG. 2.

It is to be understood that the above-described arrangements are merely illustrative of the many possible specific embodiments which can be devised to represent application of the principles of our invention. Numerous and varied other arrangements can be devised in accordance with these principles by thosed skilled in the art without departing from the spirit and scope of the invention.

In particular, it should be clear that our invention is applicable to DH lasers of a general type which would include a pair of wide bandgap, opposite conductivity type cladding layers which are separated by and contiguous with a narrower bandgap active region. The latter may either be n- or p-type or both as in the case where the p-n junction is intermediate the active region. Group III(a)–V(a) compound materials are particularly suitable for use in our invention. The most common material used for the active region is $Al_xGa_{1-x}R$ where $0 \leq x \lesssim 0.4$, R includes at least As and may include P or Sb. The cladding layers similarly comprise $Al_yGa_{1-y}R$ and $Al_zGa_{1-z}R$, where $0 \leq y,z \leq 1$ and y and $z > x$. However, GaAsSb is also an appropriate material. Other more complicated variants of the DH laser, such as the separate confinement heterostructure (See U.S. Pat. No. 3,691,476.) and the PpnN gain asymmetry heterostructure (See U.S. Pat. No. 3,383,359.), are also contemplated within the scope of our invention.

What is claimed is:

1. In an array of stripe geometry mesa semiconductor junction lasers, a structure comprising:
   a semiconductor body,
   a plurality of parallel, separate free-standing ridges formed as an integral part of said body and separated by a plurality of parallel, separate channels so that said ridges are trapezoidal in shape, being wider at their topmost surfaces than at their bottoms,
   a plurality of epitaxial semiconductor layers deposited on the topmost surface of said ridges so as to form a p-n junction at the interface of at least two contiguous ones of said layers, said layers being formed by directing a plurality of molecular beams substantially perpendicular to said major surface.

2. The structure of claim 1 including a metal layer on the top of the uppermost of said epitaxial layers and physically separate therefrom a metal layer in said channels, said metal layers being formed by directing a metal vapor substantially normal to said major surface.

3. The structure of claim 1 wherein said plurality of epitaxial layers form double heterostructure lasers on each of said ridges.

4. The structure of claim 3 wherein said layers include an $Al_yGa_{1-y}R$ cladding layer of one conductivity type, $0 \leq y \leq 1$ and R is selected from the group consisting of As, P, Sb, and combinations thereof, an $Al_xGa_{1-x}R$ active region, $0 \leq x \lesssim 0.4$ and an $Al_zGa_{1-z}R$, cladding layer of the opposite conductivity type, $0 \leq z \leq 1$, $y,z > x$.

* * * * *